(12) United States Patent
Huang et al.

(10) Patent No.: US 7,868,402 B2
(45) Date of Patent: Jan. 11, 2011

(54) PACKAGE AND PACKAGING ASSEMBLY OF MICROELECTROMECHANICAL SYSTEM MICROPHONE

(75) Inventors: Chao-Ta Huang, Hsinchu (TW); Hsin-Tang Chien, Luodong Town (TW)

(73) Assignee: Industrial Technology Research Institute, Hsinchu (TW)

( * ) Notice: Subject to any disclaimer, the term of this patent is extended or adjusted under 35 U.S.C. 154(b) by 271 days.

(21) Appl. No.: 11/871,149

(22) Filed: Oct. 11, 2007

(65) Prior Publication Data

US 2008/0283988 A1 Nov. 20, 2008

(30) Foreign Application Priority Data

May 15, 2007 (TW) .............................. 96117297 A

(51) Int. Cl.
*H01L 29/84* (2006.01)
(52) U.S. Cl. ............................... 257/416; 257/E27.122
(58) Field of Classification Search ................. 257/686, 257/777, 416, E27.122
See application file for complete search history.

(56) References Cited

U.S. PATENT DOCUMENTS

| | | | |
|---|---|---|---|
| 5,408,534 A | 4/1995 | Lenzini et al. | |
| 5,740,261 A | 4/1998 | Loeppert et al. | |
| 5,889,872 A | 3/1999 | Sooriakumar et al. | |
| 6,075,867 A | 6/2000 | Bay et al. | |
| 6,088,463 A | 7/2000 | Rombach et al. | |
| 6,178,249 B1 | 1/2001 | Hietanen et al. | |
| 6,420,203 B1 | 7/2002 | Okawa et al. | |
| 6,522,762 B1 | 2/2003 | Mullenborn et al. | |
| 6,594,369 B1 | 7/2003 | Une | |
| 6,654,473 B2 | 11/2003 | Collins | |
| 6,732,588 B1 | 5/2004 | Mullenborn et al. | |
| 6,781,231 B2 | 8/2004 | Minervini | |
| 6,924,429 B2 | 8/2005 | Kasai et al. | |
| 6,928,178 B2 | 8/2005 | Chang | |
| 7,202,552 B2 * | 4/2007 | Zhe et al. ..................... | 257/659 |
| 7,436,054 B2 * | 10/2008 | Zhe ........................... | 257/686 |
| 2005/0018864 A1 * | 1/2005 | Minervini ................... | 381/175 |
| 2005/0185182 A1 | 8/2005 | Raab et al. | |
| 2008/0197485 A1 * | 8/2008 | Theuss et al. ............... | 257/723 |

FOREIGN PATENT DOCUMENTS

JP 2007-060389 3/2007

OTHER PUBLICATIONS

"Office Action of Taiwan counterpart application", issued on Oct. 7, 2009, p. 1-p. 6.

* cited by examiner

*Primary Examiner*—David A Zarneke
*Assistant Examiner*—Jenny L Wagner
(74) *Attorney, Agent, or Firm*—Jianq Chyun IP Office

(57) ABSTRACT

A package of microelectromechanical system (MEMS) microphone is suitable for being mounted on a printed circuit board. The package has a cover and at least one MEMS microphone. The cover has an inner surface and a conductive trace disposed thereon. The MEMS microphone is mounted on the inner surface of the cover and electrically connected to the conductive trace, and has an acoustic pressure receiving surface. When the cover is mounted on the printed circuit board, the cover and the printed circuit board construct an acoustic housing which has at least one acoustic hole passing through the cover or the printed circuit board, and the conductive trace on the inner surface of the cover is electrically connected to the printed circuit board.

21 Claims, 5 Drawing Sheets

PACKAGE AND PACKAGING ASSEMBLY OF MICROELECTROMECHANICAL SYSTEM MICROPHONE

CROSS-REFERENCE TO RELATED APPLICATION

This application claims the priority benefit of Taiwan application serial no. 96117297, filed on May 15, 2007. All disclosure of the Taiwan application is incorporated herein by reference.

BACKGROUND OF THE INVENTION

1. Field of the Invention

The present invention relates to a microelectromechanical system (MEMS) microphone. More particularly, the present invention relates to a package and a packaging assembly of the MEMS microphone.

2. Description of Related Art

Along with the increasing demands for mobile phones, requirements on acoustic quality of mobile phones, and maturity of hearing aid technology, the demands for high-quality mini-microphone are rapidly growing. Capacitor microphones which are fabricated by MEMS technology have advantages of light weight, small volume, and good signal quality, so MEMS microphones have gradually become mainstream products of the mini-microphone.

A "Microelectromechanical system package with environmental and interference shield" has been disclosed in U.S. Pat. No. 6,781,231, which includes a MEMS microphone, a substrate, and a cover. The substrate has a surface for carrying the MEMS microphone. The cover includes a conductive layer having a central portion and a peripheral portion around the central portion. The peripheral portion of the cover is connected to the substrate to form a housing. The central portion of the cover and the substrate are separated by a space for accommodating the MEMS microphone. The housing has an acoustic hole to allow acoustic signals to reach the MEMS microphone.

SUMMARY OF THE INVENTION

Accordingly, the present invention is directed to a package of MEMS microphone, adapted to be mounted on the printed circuit board for converting an acoustic signal to an electronic signal.

The present invention is directed to a packaging assembly of the MEMS microphone, for converting the acoustic signal to the electronic signal.

The present invention provides a package of the MEMS microphone including a cover and at least one MEMS microphone. The cover has an inner surface and a conductive trace disposed on the inner surface. The MEMS microphone is mounted on the inner surface of the cover and is electrically connected with the conductive trace. When the cover is assembled to a printed circuit board, the cover and the printed circuit board construct an acoustic housing.

The present invention provides a packaging assembly of the MEMS microphone including a cover, at least one MEMS microphone, and a printed circuit board. The cover has an inner surface, and a conductive trace disposed on the inner surface. The MEMS microphone is mounted on the inner surface of the cover, and is electrically connected to the conductive trace. The printed circuit board allows the cover to be assembled thereon, and construct an acoustic housing with the cover.

In the present invention, the cover is used to carry the MEMS microphone, and is connected to the printed circuit board, and the cover and the printed circuit board construct an acoustic housing for accommodating the MEMS microphone.

In order to make the aforementioned and other features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a portion of this specification. The drawings illustrate embodiments of the invention and, together with the description, serve to explain the principles of the invention.

DESCRIPTION OF EMBODIMENTS

Figure 1:
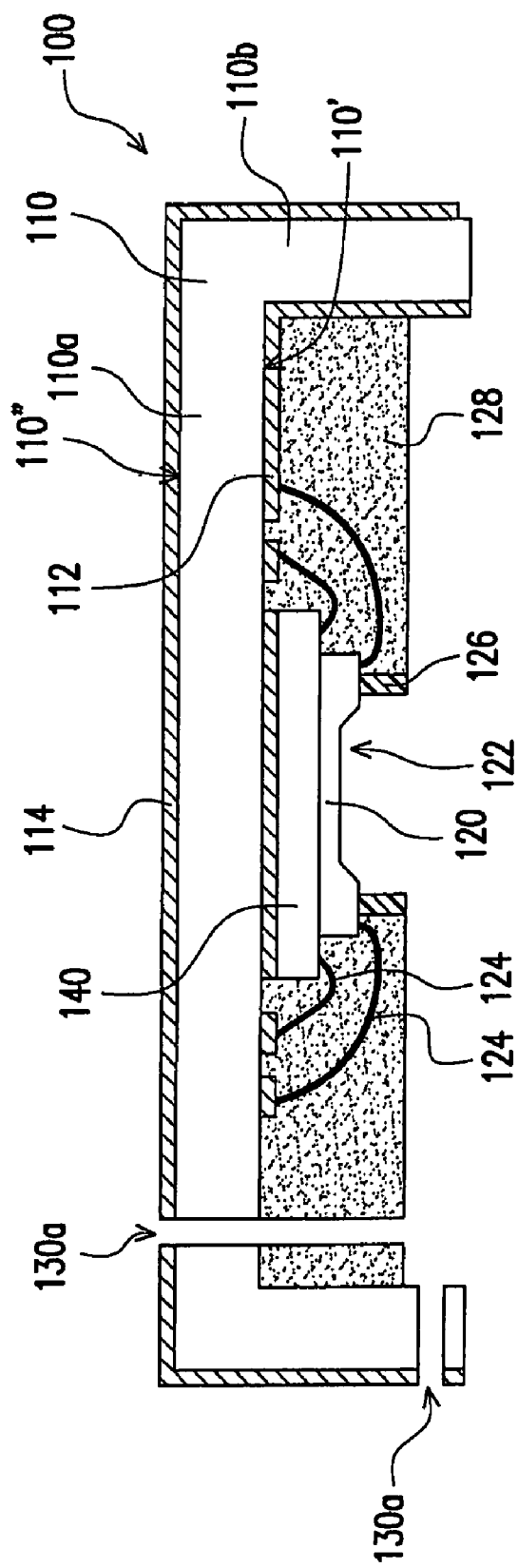
FIG. 1 is a cross sectional view of a package of a MEMS microphone according to an embodiment of the present invention.
Figure 2:
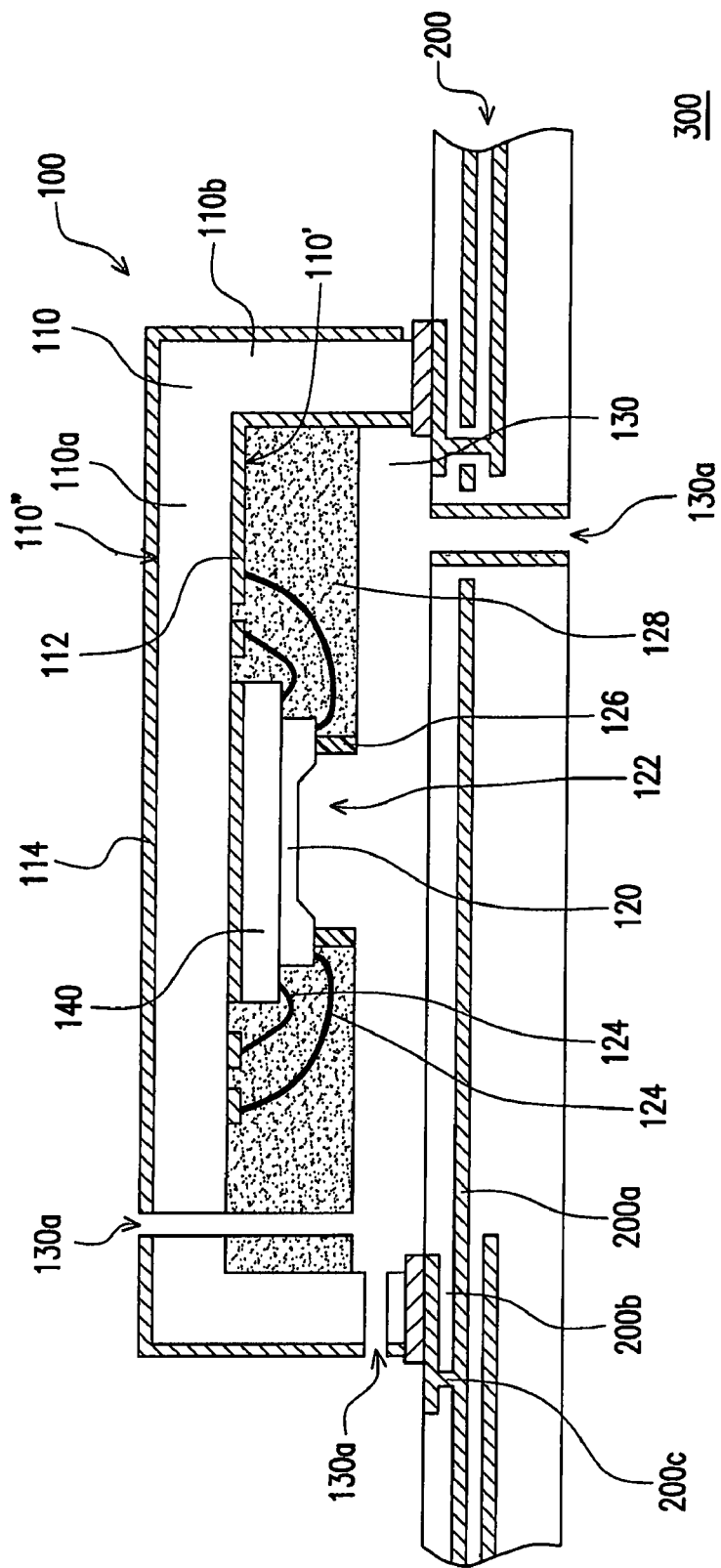
FIG. 2 is a partial cross-sectional view of the package of the MEMS microphone of FIG. 1 assembled to the printed circuit board.

FIG. 1 is a cross-sectional view of a package of a MEMS microphone according to an embodiment of the present invention, and FIG. 2 is a partial cross-sectional view of the package of the MEMS microphone of FIG. 1 assembled to the printed circuit board. Referring to FIGS. 1 and 2 together, the package of the MEMS microphone (hereafter referred to as the package) 100 of this embodiment is adapted to be assembled to a printed circuit board 200, in which the printed circuit board 200 includes a plurality of conductive layers 200$a$, a plurality of dielectric layers 200$b$ stacked alternately with the conductive layers 200$a$, and a plurality of conductive vias 200$c$ passing through the dielectric layers 200$b$ and electrically connected with the conductive layers 200$a$.

The package 100 includes a cover 110 which can be fabricated by plastic material or ceramic material. The cover 110 has an inner surface 110' and a conductive trace 112 disposed on the inner surface 110'. The conductive trace 112 can be fabricated by firstly forming a metal film on the inner surface 110' of the cover 110 through a coating technology, and then patterning the metal film to form the conductive trace 112 through an etching technology.

The package 100 further includes a MEMS microphone 120 disposed on the inner surface 110' of the cover 110 and electrically connected to the conductive trace 112, and has an acoustic pressure receiving surface 122. In this embodiment, the MEMS microphone 120 can be adhered onto the inner surface 110' of the cover 110, and electrically connected to the conductive trace 112 of the cover 110 through wire bonding. When the MEMS microphone 120 is electrically connected to the conductive trace 112 of the cover 110 through a plurality of wires 124, a dam bar 126 is formed on the MEMS microphone 120, and an encapsulant 128 is formed in a scope surrounded the cover 110 and the dam bar 126 through an encapsulation technology, so as to protect the MEMS microphone 120 and the wires 124.

When the cover 110 is assembled to the printed circuit board 200, the cover 110 and the printed circuit board 200 construct an acoustic housing 130, in which the acoustic housing 130 has one or more acoustic hole(s) 130a, which respectively pass through the cover 110 and the printed circuit board 200. In this embodiment, the cover 110 has a top wall 110a and a sidewall 110b located around the top wall 110a and substantially surrounding the top wall 110a, in which the shape of a space formed by the top wall 110a and the sidewall 110b can be a cuboid or a cylinder, and the acoustic holes 130a respectively penetrates through the top wall 110a and the sidewall 110b. In addition, the acoustic holes 130a can be formed in the cover 110 and the printed circuit board 200 through a drilling technology.

The package 100 further includes an integrated circuit chip (IC chip) 140 mounted on the inner surface 110' of the cover 110, electrically connected with the conductive trace 112, and located in the acoustic housing 130. The MEMS microphone 120 is disposed on the IC chip 140. In this embodiment, the MEMS microphone 120 can be adhered on the IC chip 140, and the IC chip 140 can be electrically connected to the conductive trace 112 of the cover 110 by wire bonding. The cover 110 can further have a conductive layer 114 disposed on an outer surface 110" opposite to the inner surface 110' thereof. When the cover 110 is assembled to the printed circuit board 200, the conductive layer 114 is electrically connected to one of the conductive layer 200a of the printed circuit board 200, and forms a shield together with the conductive layer 200a so as to prevent the electromagnetic wave from interfering the MEMS microphone 120 and the IC chip 140. In this embodiment, the coating technology can be used to form the conductive layer 114 on the outer surface 110" of the cover.

When the cover 110 is assembled to the printed circuit board 200, the package 100 and the printed circuit board 200 constructs a packaging assembly of a MEMS microphone 300.

Figure 3:
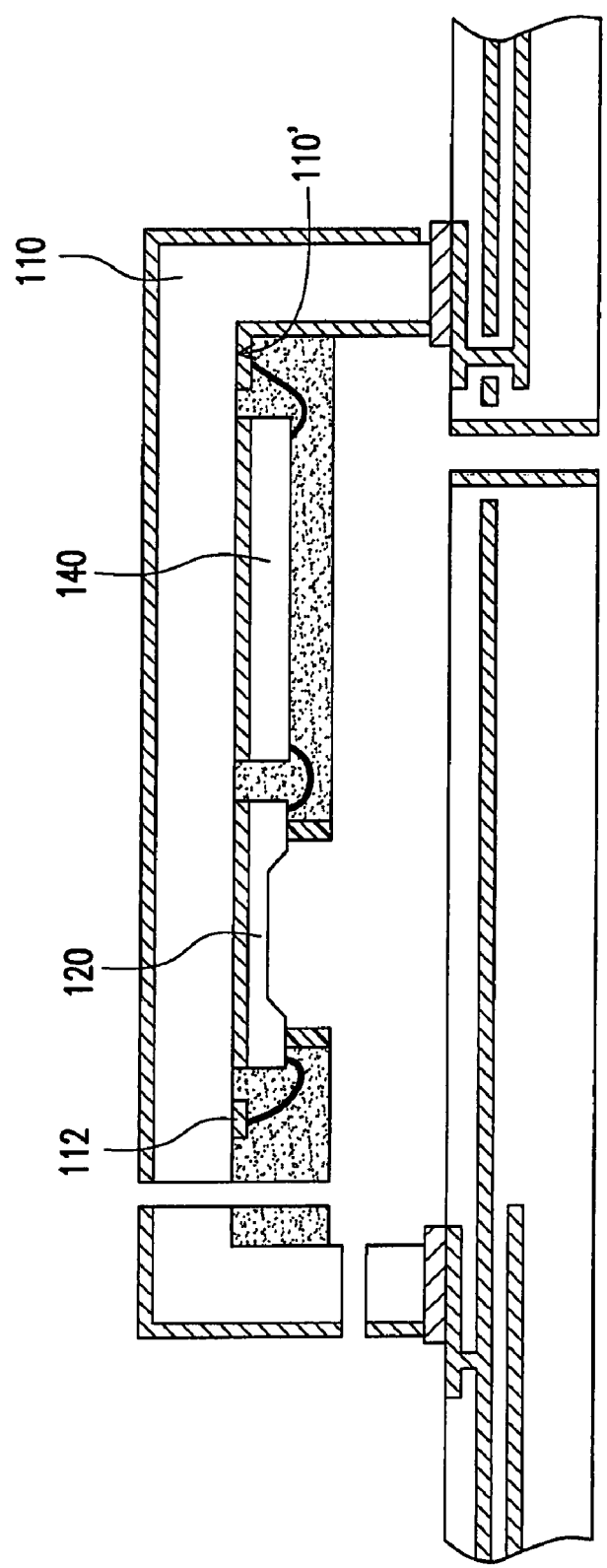
FIG. 3 is a partial cross-sectional view of a package of a MEMS microphone assembled to the printed circuit board according to another embodiment of the present invention.

FIG. 3 is a partial cross-sectional view of a package of a MEMS microphone assembled to the printed circuit board according to another embodiment of the present invention. Referring to FIG. 3, the MEMS microphone 120 can also be directly disposed on the inner surface 110' of the cover 110, and the MEMS microphone 120 can be electrically connected to the IC chip 140, and can be electrically connected with the conductive trace 112 on the inner surface 110' of the cover 110. In addition, the IC chip 140 can also be directly disposed on the inner surface 110' of the cover 110, and the IC chip 140 can be electrically connected with the conductive trace 112 on the inner surface 110' of the cover 110.

Figure 4:
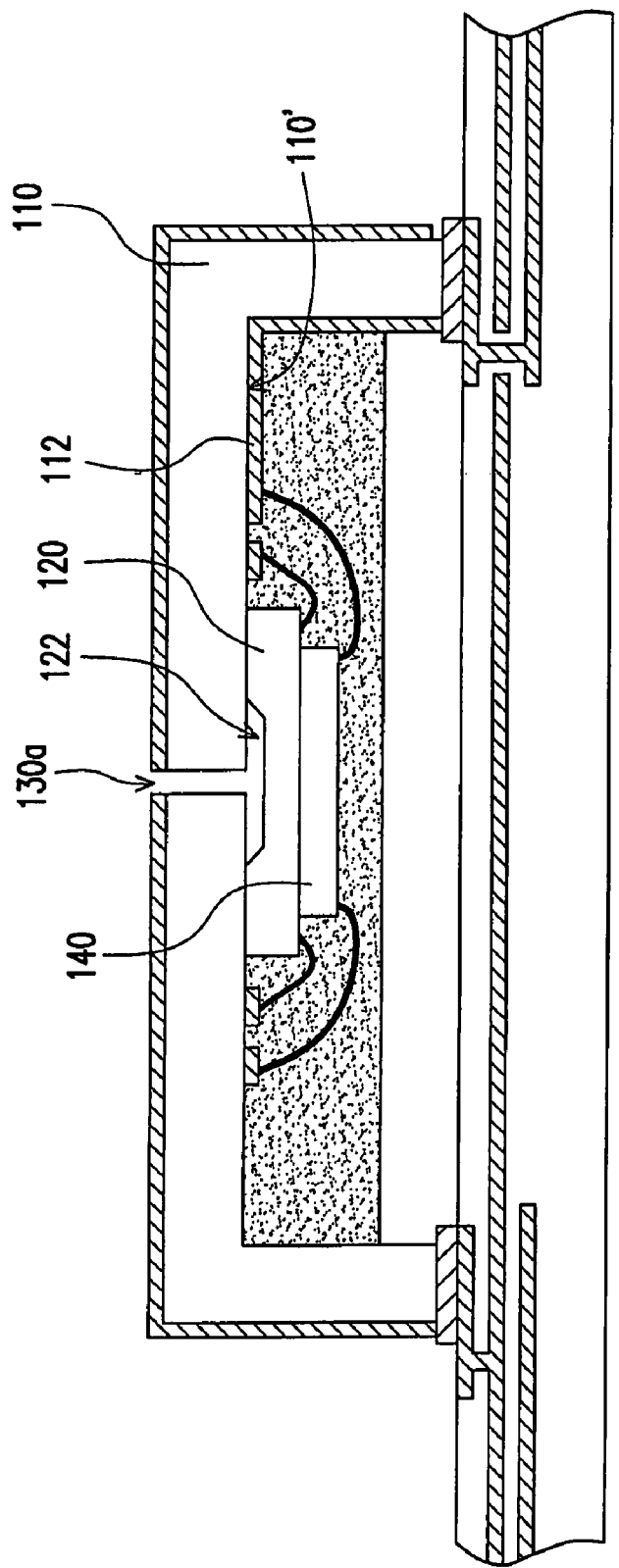
FIG. 4 is a partial cross-sectional view of a package of a MEMS microphone assembled to the printed circuit board according to still another embodiment of the present invention.

FIG. 4 is a partial cross-sectional view of a package of a MEMS microphone assembled to the printed circuit board according to still another embodiment of the present invention. Referring to FIG. 4, one side of the MEMS microphone 120 having an acoustic pressure receiving surface 122 is directly disposed on the inner surface 110' of the cover 110. The acoustic hole 130a passes through the cover 110 to allow the acoustic pressure receiving surface 122 to communicate with the outside. The MEMS microphone 120 can be electrically connected with the conductive trace 112 on the inner surface 110' of the cover 110. In addition, the IC chip 140 can also be directly disposed on the MEMS microphone 120, and can be electrically connected with the conductive trace 112 on the inner surface 110' of the cover 110.

Figure 5:
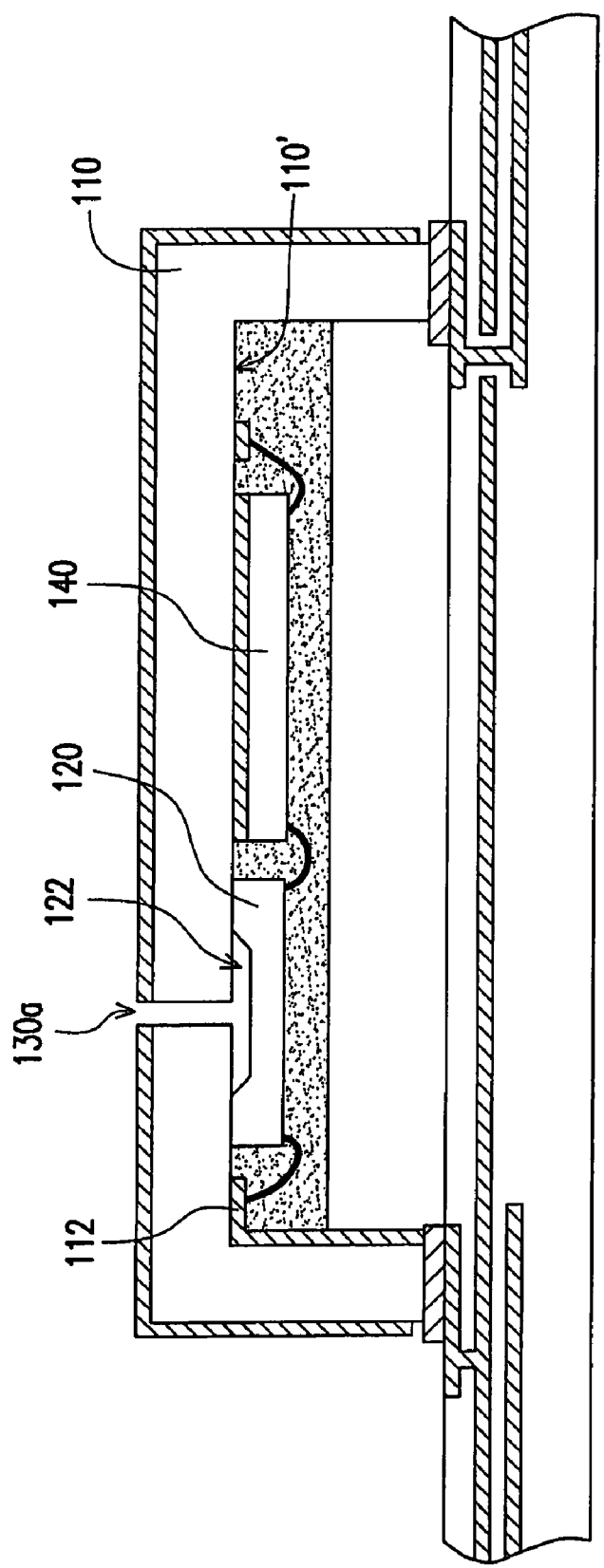
FIG. 5 is a partial cross-sectional view of a package of a MEMS microphone assembled to the printed circuit board according to yet another embodiment of the present invention.

FIG. 5 is a partial cross-sectional view of a package of a MEMS microphone assembled to the printed circuit board according to yet another embodiment of the present invention. Referring to FIG. 5, one side of the MEMS microphone 120 having the acoustic pressure receiving surface 122 is directly disposed on the inner surface 110' of the cover 110. The acoustic hole 130a passes through the cover 110 to allow the acoustic pressure receiving surface 122 to communicate with the outside. The MEMS microphone 120 can be electrically connected to the IC chip 140, and can be electrically connected with the conductive trace 112 on the inner surface 110' of the cover 110. In addition, the IC chip 140 can also be directly disposed on the inner surface 110' of the cover 110, and the IC chip 140 can be electrically connected with the conductive trace 112 on the inner surface 110' of the cover 110.

To sum up, the present invention uses the cover to carry the MEMS microphone and to connect to the printed circuit board. The cover and the printed circuit board form an acoustic housing, so as to accommodate the MEMS microphone therein. Therefore, the present invention can be used to package the MEMS microphone, and can be used in conjunction with the printed circuit board to provide the acoustic housing for the MEMS microphone, so as to facilitate the MEMS microphone to convert the acoustic signal to the electronic signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package of a microelectromechanical system (MEMS) microphone, comprising:
   a cover comprising a top wall and a sidewall surrounding the top wall, and having an inner surface and a conductive trace disposed on the inner surface; and
   at least one MEMS microphone mounted on the inner surface of the cover and electrically connected with the conductive trace, wherein when the cover is assembled to a printed circuit board, the cover and the printed circuit board construct an acoustic housing, the printed circuit board forms a bottom of the acoustic housing, and wherein the conductive trace extends from the top wall through the sidewall to reach the printed circuit board.

2. The package of the MEMS microphone as claimed in claim 1, wherein the cover has at least one acoustic hole passing through the cover.

3. The package of the MEMS microphone as claimed in claim 1, wherein the conductive trace of the cover is electrically connected to the printed circuit board.

4. The package of the MEMS microphone as claimed in claim 1, wherein the cover has a conductive layer disposed on an outer surface opposite to the inner surface thereof, and electrically connected to the conductive layer of the printed circuit board when the cover is assembled to the printed circuit board.

5. The package of the MEMS microphone as claimed in claim 1, wherein a shape formed by the top wall and the sidewall is a cuboid or a cylinder.

6. The package of the MEMS microphone as claimed in claim 1, further comprising:
   at least one IC chip mounted on the inner surface of the cover, electrically connected with the conductive trace, and located in the acoustic housing, wherein the MEMS microphone is disposed on the IC chip.

7. The package of the MEMS microphone as claimed in claim 6, wherein the MEMS microphone is electrically connected to the IC chip or is electrically connected to the conductive trace on the inner surface of the cover.

8. The package of the MEMS microphone as claimed in claim 1, further comprising:
   at least one IC chip located in the acoustic housing and mounted on the MEMS microphone.

9. The package of the MEMS microphone as claimed in claim 8, wherein the IC chip is electrically connected to the MEMS microphone or is electrically connected to the conductive trace on the inner surface of the cover.

10. The package of the MEMS microphone as claimed in claim 1, further comprising:
    at least one IC chip mounted on the inner surface of the cover, electrically connected with the conductive trace, and located in the acoustic housing, wherein the MEMS microphone is disposed on the inner surface of the cover and electrically connected to the IC chip or electrically connected to the conductive trace on the inner surface of the cover.

11. A packaging assembly of the MEMS microphone, comprising:
    a cover comprising a top wall and a sidewall surrounding the top wall, and having an inner surface and a conductive trace disposed on the inner surface; and
    at least one MEMS microphone mounted on the inner surface of the cover and electrically connected with the conductive trace; and
    a printed circuit board for the cover to be assembled thereon, constructing an acoustic housing with the cover, and forming a bottom of the acoustic housing, wherein the conductive trace extends from the top wall through the sidewall to reach the printed circuit board.

12. The packaging assembly of the MEMS microphone as claimed in claim 11, wherein the cover has at least one acoustic hole passing through the cover.

13. The packaging assembly of the MEMS microphone as claimed in claim 11, wherein the printed circuit board has at least one acoustic hole passing through the printed circuit board.

14. The packaging assembly of the MEMS microphone as claimed in claim 11, wherein the conductive trace of the cover is electrically connected with the printed circuit board.

15. The packaging assembly of the MEMS microphone as claimed in claim 11, wherein the cover has a conductive layer disposed on an outer surface opposite to the inner surface thereof and electrically connected to the conductive layer of the printed circuit board.

16. The packaging assembly of the MEMS microphone as claimed in claim 11, wherein the shape formed by the top wall and the sidewall is a cuboid or a cylinder.

17. The packaging assembly of the MEMS microphone as claimed in claim 11, further comprising:
    at least one IC chip mounted on the inner surface of the cover, electrically connected with the conductive trace, and located in the acoustic housing, wherein the MEMS microphone is disposed on the IC chip.

18. The packaging assembly of the MEMS microphone as claimed in claim 17, wherein the MEMS microphone is electrically connected to the IC chip or is electrically connected to the conductive trace on the inner surface of the cover.

19. The packaging assembly of the MEMS microphone as claimed in claim 11, further comprising:
    at least one IC chip mounted on the MEMS microphone and located in the acoustic housing.

20. The packaging assembly of the MEMS microphone as claimed in claim 19, wherein the IC chip is electrically connected to the MEMS microphone or is electrically connected to the conductive trace on the inner surface of the cover.

21. The packaging assembly of the MEMS microphone as claimed in claim 11, further comprising:
    at least one IC chip mounted on the inner surface of the cover, electrically connected with the conductive trace, and located in the acoustic housing, wherein the MEMS microphone is disposed on the inner surface of the cover and electrically connected to the IC chip or electrically connected to the conductive trace on the inner surface of the cover.

* * * * *